(12) United States Patent
Chang et al.

(10) Patent No.: US 10,643,988 B2
(45) Date of Patent: *May 5, 2020

(54) INTELLIGENT DIODE STRUCTURES

(71) Applicant: Taiwan Semiconductor Manufacturing Co., Ltd., Hsinchu (TW)

(72) Inventors: Yi-Feng Chang, Xinbei (TW); Jam-Wem Lee, Hsinchu (TW); Li-Wei Chu, Hsinchu (TW); Po-Lin Peng, Taoyuan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/549,271

(22) Filed: Aug. 23, 2019

(65) Prior Publication Data

US 2019/0378832 A1    Dec. 12, 2019

Related U.S. Application Data

(63) Continuation of application No. 15/938,496, filed on Mar. 28, 2018, now Pat. No. 10,411,005.
(Continued)

(51) Int. Cl.
*H01L 27/02* (2006.01)
*H01L 27/08* (2006.01)
(Continued)

(52) U.S. Cl.
CPC ...... *H01L 27/0255* (2013.01); *H01L 27/0629* (2013.01); *H01L 27/0814* (2013.01);
(Continued)

(58) Field of Classification Search
CPC ............... H01L 27/0255; H01L 29/861; H01L 29/0649; H01L 27/0814; H01L 27/0262;
(Continued)

(56) References Cited

U.S. PATENT DOCUMENTS

| 10,411,005 | B2* | 9/2019 | Chang ................. H01L 27/0255 |
| 2011/0042747 | A1 | 2/2011 | Galy et al. |
| 2011/0207409 | A1 | 8/2011 | Ker et al. |

OTHER PUBLICATIONS

Office Action, dated Aug. 8, 2019, Korean Intellectual Property Office Appl. No. 10-2018-0072607, 7 pages.

* cited by examiner

*Primary Examiner* — Caleen O Sullivan
(74) *Attorney, Agent, or Firm* — Sterne, Kessler, Goldstein & Fox P.L.L.C.

(57) ABSTRACT

The present disclosure describes exemplary configurations and arrangements for various intelligent diodes. The intelligent diodes of the present disclosure can be implemented as part of electrostatic discharge protection circuitry to protect other electronic circuitry from the flow of electricity caused by electrostatic discharge events. The electrostatic discharge protection circuitry dissipates one or more unwanted transient signals which result from the electrostatic discharge event. In some situations, some carrier electrons and/or carrier holes can flow from intelligent diodes of the present disclosure into a semiconductor substrate. The exemplary configurations and arrangements described herein include various regions designed collect these carrier electrons and/or carrier holes to reduce the likelihood these carrier electrons and/or carrier holes cause latch-up of the other electronic circuitry.

20 Claims, 9 Drawing Sheets

Related U.S. Application Data

(60) Provisional application No. 62/586,714, filed on Nov. 15, 2017.

(51) Int. Cl.
    *H01L 29/861*     (2006.01)
    *H01L 27/12*     (2006.01)
    *H01L 27/06*     (2006.01)
    *H01L 29/06*     (2006.01)

(52) U.S. Cl.
    CPC ........ *H01L 27/1255* (2013.01); *H01L 29/861* (2013.01); *H01L 29/8613* (2013.01); *H01L 29/0649* (2013.01)

(58) Field of Classification Search
    CPC ............. H01L 27/0277; H01L 27/0251; H01L 29/7436; H01L 29/78; H01L 29/0834; H01L 29/0839; H01L 29/7391; H01L 29/87
    USPC .......................................... 257/506
    See application file for complete search history.

INTELLIGENT DIODE STRUCTURES

CROSS-REFERENCE TO RELATED APPLICATIONS

The present application is a continuation of U.S. patent application Ser. No. 15/938,496, filed Mar. 28, 2018, now U.S. Pat. No. 10,411,005, which claims the benefit of U.S. Provisional Patent Appl. No. 62/586,714, filed Nov. 15, 2017, which are incorporated herein by reference in their entireties.

BACKGROUND

Electrostatic discharge (ESD) represents an instantaneous, or near instantaneous, flow of electricity between electrically charged objects. Often times, charge accumulates in one object, such as a human hand to provide an example, through electrostatic induction. A electrostatic discharge event occurs once this object is placed sufficiently proximate to another, lesser charged object, such as an electronic device to provide an example, causing the flow of electricity between these objects, often resulting in a visible spark. This flow of electricity can overwhelm the electronic device causing failure. In some situations, less dramatic forms of this discharge may be neither seen nor heard, yet still be large enough to cause damage to the electronic device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
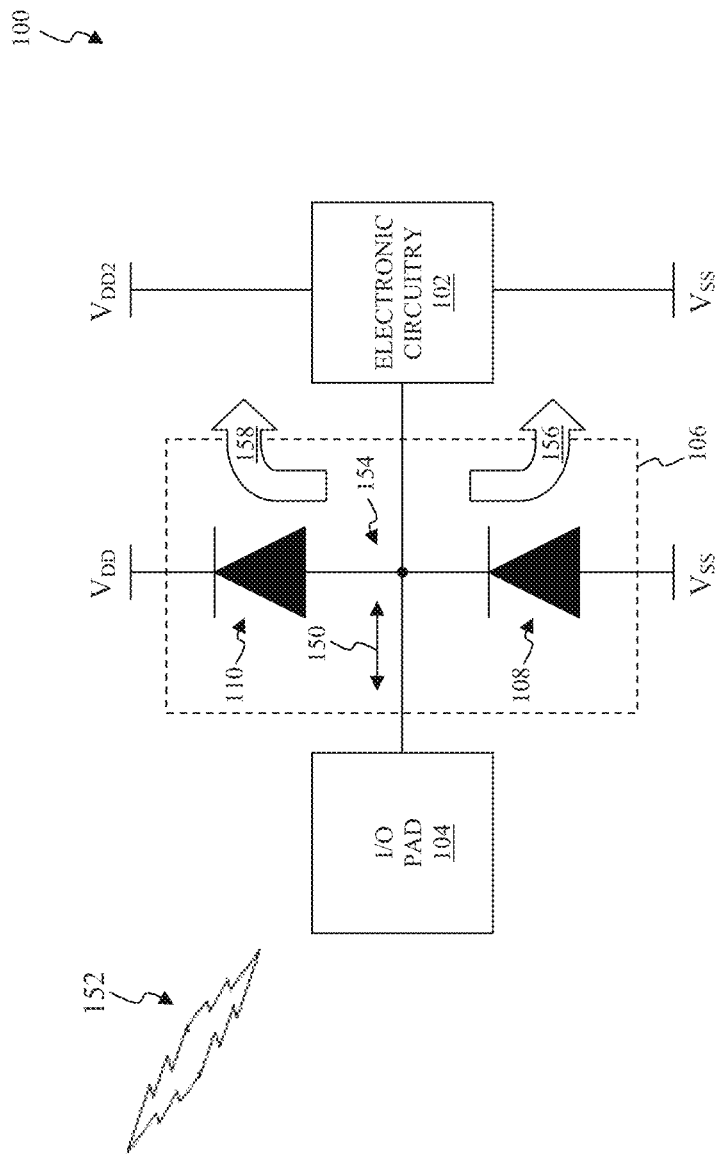
FIG. 1 illustrates a block diagram of exemplary electrostatic discharge protection circuitry according to an exemplary embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is does not in itself dictate a relationship between the various embodiments and/or configurations described.

Overview

The present disclosure describes exemplary configurations and arrangements for various intelligent diodes. The intelligent diodes of the present disclosure can be implemented as part of electrostatic discharge protection circuitry to protect other electronic circuitry from the flow of electricity caused by electrostatic discharge events. The electrostatic discharge protection circuitry dissipates one or more unwanted transient signals which result from the electrostatic discharge event. In some situations, some carrier electrons and/or carrier holes can flow from intelligent diodes of the present disclosure into a semiconductor substrate. The exemplary configurations and arrangements described herein include various regions designed collect these carrier electrons and/or carrier holes to reduce the likelihood these carrier electrons and/or carrier holes cause latch-up of the other electronic circuitry.

Exemplary Electrostatic Discharge Protection Circuitry

FIG. 1 illustrates a block diagram of exemplary electrostatic discharge protection circuitry according to an exemplary embodiment of the present disclosure. In the exemplary embodiment illustrated in FIG. 1, an integrated circuit 100 includes electrostatic discharge protection circuitry to dissipate one or more unwanted transient signals 150 flowing through the integrated circuit 100 caused by an electrostatic discharge event 152. In an exemplary embodiment, the integrated circuit 100 can be fabricated onto a semiconductor substrate using a semiconductor fabrication technique, referred to as being "on-chip." In this exemplary embodiment, the integrated circuit 100 is situated within one or more diffusion layers, one or more polysilicon layers, and/or one or more metal layers of a semiconductor layer stack. In this exemplary embodiment, the one or more diffusion layers, the one or more polysilicon layers, and/or the one or more metal layers of the semiconductor layer stack are situated within or onto a semiconductor substrate of the semiconductor layer stack. The semiconductor substrate can include a semiconductor material, such as a silicon crystal, but can include other materials, or combinations of materials, such as sapphire or any other suitable material that will be apparent to those skilled in the relevant art(s) without departing from the spirit and scope of the present disclosure. Also, in this exemplary embodiment, the one or more metal layers of the semiconductor stack can include one or more conductive materials such as tungsten (W), aluminum (Al), copper (Cu), gold (Au), silver (Ag), or platinum (Pt) to provide some examples, interdigitated with one or more non-conductive materials, such as silicon dioxide ($SiO_2$), spin-on-glass, silicon nitride ($Si_3N_4$), silicon carbide (SiC), silicon carbon nitride, silicon oxynitride ($Si_2N_2O$), and/or fluorine-doped silicate glass (FSG) to provide some examples. As illustrated in FIG. 1, the integrated circuit 100 includes electronic circuitry 102, an input/output (I/O) pad 104, and electrostatic discharge protection circuitry 106.

The electronic circuitry 102 can include one or more analog circuits, one or more digital circuits, and/or one or more mixed-signal circuits. The one or more analog circuits operate on one or more analog signals that continuously vary in time. The one or more analog circuits can include one or more current sources, one or more current mirrors, one or more amplifiers, one or more bandgap references, and/or other suitable analog circuits that will be apparent to those skilled in the relevant art(s) without departing from the spirit and scope of the present disclosure. The one or more digital circuits operate on one or more digital signals having one or more discrete levels. The one or more digital circuits can include one or more logic gates, such as logical AND gates, logical OR gates, logical XOR gates, logical XNOR gates, or logical NOT gates to provide some examples, and/or other suitable digital circuits that will be apparent to those skilled in the relevant art(s) without departing from the spirit and scope of the present disclosure. The one or more mixed-signal circuits represent a combination of the one or more analog circuits and the one or more digital circuits.

The I/O pad 104 can represent an interconnection between the electronic circuitry 102 and one or more other electrical, mechanical, and/or electro-mechanical circuits communicatively coupled to the integrated circuit 100. This interconnection communicates one or more signals, such as one or more information signals, one or more power signals, one or more clocking signals to provide some examples, between the electronic circuitry 102 and the one or more other electrical, mechanical, and/or electro-mechanical circuits. In an exemplary embodiment, the I/O pad 104 represents one or more regions of the one or more conductive materials within the one or more metal layers of the semiconductor stack. As illustrated in FIG. 1, the electrostatic discharge event 152 can occur between the I/O pad 104 and one or more electrically charged objects sufficiently proximate to the integrated circuit 100. Generally, the electrostatic discharge event 152 can represent an instantaneous, or near instantaneous, flow of electricity between the one or more electrically charged objects and the I/O pad 104 resulting from a difference in electrical potential between the one or more electrically charged objects and the I/O pad 104. The electrostatic discharge event 152 occurs when the one or more electrically charged objects and the I/O pad 104 are placed sufficiently proximate to each other causing the flow of electricity between the one or more electrically charged objects and the I/O pad 104, often resulting in a visible spark. The flow of electricity can be from the one or more electrically charged objects to the I/O pad 104 when the electrical potential of the one or more electrically charged objects is greater than the electrical potential of the I/O pad 104 or to the one or more electrically charged objects from the I/O pad 104 when the electrical potential of the one or more electrically charged objects is less than the electrical potential of the I/O pad 104.

The electrostatic discharge protection circuitry 106 dissipates the one or more unwanted transient signals 150 traversing between the electronic circuitry 102 and the I/O pad 104 which result from the electrostatic discharge event 152. The one or more unwanted transient signals 150 can cause one or more signals at circuitry node 154 to have sufficient energy to breakdown various semiconductor devices within the electronic circuitry 102 which can cause permanent damage. Examples of breakdown can include punch-through breakdown, avalanche breakdown, and gate oxide breakdown to provide some examples. For example, the one or more unwanted transient signals 150 traversing between the electronic circuitry 102 and the I/O pad 104 can constructively interfere with one or more desired signals traversing between the electronic circuitry 102 and the I/O pad 104. In this example, this constructively interference can increase various voltages of the one or more desired signals at the circuitry node 154 to raise above a first supply voltage, such as a positive supply voltage $V_{DD}$ as illustrated in FIG. 1, or to fall below a second supply voltage, such as a negative supply voltage $V_{SS}$ as illustrated in FIG. 1.

In the exemplary embodiment illustrated in FIG. 1, the electrostatic discharge protection circuitry 106 includes an intelligent n-diode 108 and an intelligent p-diode 110 to dissipate the one or more unwanted transient signals 150 resulting from the electrostatic discharge event 152. In the exemplary embodiment, illustrated in FIG. 1, the intelligent n-diode 108 and the intelligent p-diode 110 are reversed biased under normal operation conditions, for example, preceding and/or subsequent to the electrostatic discharge event 152. However, during the electrostatic discharge event 152, the intelligent n-diode 108 and/or the intelligent p-diode 110 can become forward bias to dissipate the one or more unwanted transient signals 150 traversing between the electronic circuitry 102 and the I/O pad 104. For example, the intelligent n-diode 108 becomes forward biased when the one or more unwanted transient signals 150 cause the voltage at the circuitry node 154 to fall below the negative supply voltage $V_{SS}$. In this example, the intelligent n-diode 108 dissipates the one or more unwanted transient signals 150 to increase the voltage at the circuitry node 154 to be greater than the negative supply voltage $V_{SS}$. As another example, the intelligent p-diode 110 becomes forward biased when the one or more unwanted transient signals 150 cause the voltage at the circuitry node 154 to raise above the positive supply voltage $V_{DD}$. In this other example, the intelligent p-diode 110 dissipates the one or more unwanted transient signals 150 to decrease the voltage at the circuitry node 154 to be less than the positive supply voltage $V_{DD}$.

As discussed above, the electrostatic discharge protection circuitry 106 can be situated within or onto the semiconductor substrate of the semiconductor layer stack. As illustrated in FIG. 1, some carrier electrons 156 and/or some carrier holes 158 from among the one or more unwanted transient signals 150 flow from the intelligent n-diode 108 and the intelligent p-diode 110, respectively, to the semiconductor substrate as the intelligent n-diode 108 and the intelligent p-diode 110 dissipate the one or more unwanted transient signals 150. In these situations, the carrier electrons 156 and/or the carrier holes 158 can be of sufficient quantity to activate one or more parasitic structures within the electronic circuitry 102 causing latch-up. The one or more parasitic structures within the electronic circuitry 102 can be represented as a silicon controlled rectifier (SCR) within the semiconductor substrate of the electronic circuitry 102. The SCR forms a short circuit, or other low impedance pathway, between a second positive supply voltage $V_{DD2}$ of the electronic circuitry 102 and the negative supply voltage $V_{SS}$ when a sufficient number of the carrier electrons 156 and/or the carrier holes 158 are available within the semiconductor substrate of the electronic circuitry 102. The short circuit, or the other low impedance pathway, disrupts proper functioning of the electronic circuitry 102 causing the latch-up. Various exemplary embodiments for the intelligent n-diode 108 and/or the intelligent p-diode 110 are to be described in further detail below which effectively reduce the quantity of the carrier electrons 156 and/or the carrier holes 158 available within the semiconductor substrate of the electronic circuitry 102 to reduce the likelihood of activating the one or more parasitic structures within the semiconductor substrate of the electronic circuitry 102, namely, the latch-up of the electronic circuitry 102.

Exemplary Intelligent N-Diode

Figure 2:
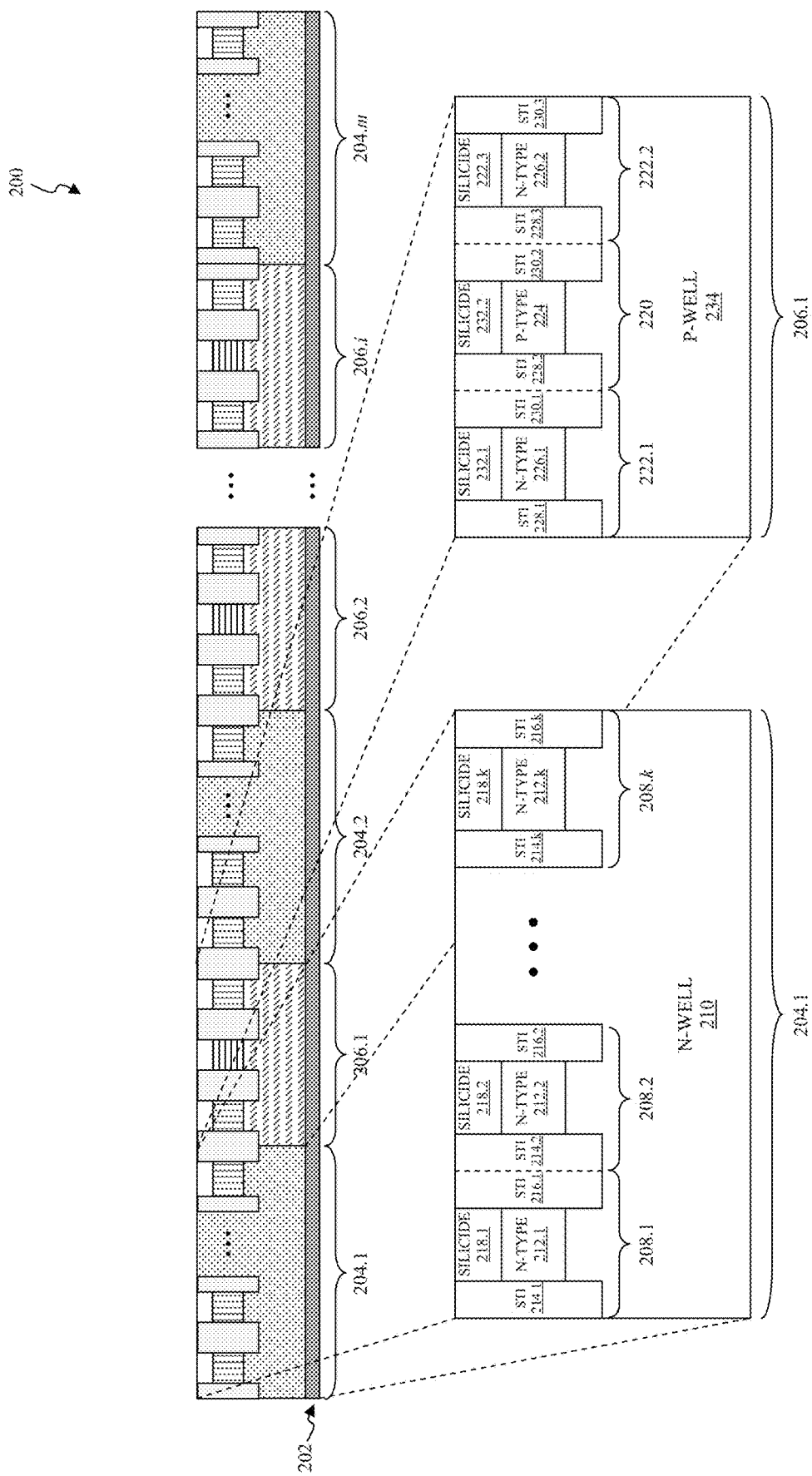
FIG. 2 illustrates a cross-sectional view of an exemplary intelligent n-diode according to an exemplary embodiment of the present disclosure.

FIG. 2 illustrates a cross-sectional view of an exemplary intelligent n-diode according to an exemplary embodiment of the present disclosure. An intelligent n-diode 200 can be situated within or onto the semiconductor substrate of a semiconductor layer stack in a substantially similar manner as the intelligent n-diode 108 as described above in FIG. 1. The intelligent n-diode 200 effectively reduces the quantity of carrier electrons available within a semiconductor substrate 202 to reduce the likelihood of activating one or more parasitic structures within other electrical, mechanical, and/or electro-mechanical circuitry, such as the electronic circuitry 102, within the semiconductor substrate 202. This reduction in the quantity of carrier electrons within the semiconductor substrate 202 similarly reduces the potential for latch-up of the other electrical, mechanical, and/or electro-mechanical circuitry. As illustrated in FIG. 2, the intelligent n-diode 200 includes n-well strap regions 204.1 through 204.m and diode finger regions 206.1 through 206.i. The intelligent n-diode 200 can be used to implement the intelligent n-diode 108 as described above.

As illustrated in FIG. 2, the n-well strap regions 204.1 through 204.m and the diode finger regions 206.1 through 206.i include n+ regions (shown using vertical lines in FIG. 2), p+ regions (shown using horizontal lines in FIG. 2), n-well regions (shown using a dotted shading in FIG. 2), p-well regions (shown a partial diagonal shading in FIG. 2), short trench isolation (STI) regions (shown a gray shading in FIG. 2), and silicide regions (shown using white shading in FIG. 2) situated within or onto the semiconductor substrate 202. In the exemplary embodiment illustrated in FIG. 2, the n-well strap regions 204.1 through 204.m are interdigitated with the diode finger regions 206.1 through 206.i to form the intelligent n-diode 200. In the exemplary embodiment illustrated in FIG. 2, the n-well strap regions 204.1 through 204.m are substantially similar to one another and the diode finger regions 206.1 through 206.i are substantially similar to one another, therefore, only the n-well strap region 204.1 from among the n-well strap regions 204.1 through 204.m and the diode finger region 206.1 from among the diode finger regions 206.1 through 206.i are described in further detail below. For ease of description, the shading of the various regions of the n-well strap region 204.1 and the diode finger region 206.1, as described above, are not illustrated in the exploded views of the n-well strap region 204.1 and the diode finger region 206.1. As illustrated in FIG. 2, the n-well strap region 204.1 includes n-type electron absorption regions 208.1 through 208.k situated in an n-well region 210. And the diode finger region 206.1 includes a p-type diode finger region 220, a first n-type diode finger region 222.1 and a second n-type diode finger region 222.2 situated in a p-well region 234.

The n-well region 210 represents an implanted n-type region within the semiconductor substrate 202 that includes one or more n-type materials. In an exemplary embodiment, the one or more n-type materials can include impurity atoms of a donor type, such as phosphorus (P), arsenic (As), antimony (Sb), or any other suitable element, compound, or mixture that is capable of donating electrons that will be apparent to those skilled in the relevant art(s) without departing from the spirit and scope of the present disclosure. Similarly, the p-well region 234 represents an implanted p-type region within the semiconductor substrate 202 that includes one or more p-type materials. In an exemplary embodiment, the one or more p-type materials include impurity atoms of an acceptor type, such as boron (B), aluminum (Al), gallium (Ga) or any other suitable element, compound, or mixture that is capable of accepting electrons that will be apparent to those skilled in the relevant art(s) without departing from the spirit and scope of the present disclosure.

In the exemplary embodiment illustrated in FIG. 2, the n-type electron absorption regions 208.1 through 208.k, the first n-type diode finger region 222.1, and the second n-type diode finger region 222.2 include n-type regions 212.1 through 212.k, a first n-type region 226.1, and a second n-type region 226.2, respectively. Although the n-type regions 212.1 through 212.k, the p-type region 224, the first n-type region 226.1 and the second n-type region 226.2 are illustrated as being in shapes of rectangles in FIG. 2, this is for illustrative purposes only. Those skilled in the relevant art(s) will recognize that other shapes, for example having one or more linear segments and/or curved segments, are possible without departing from the spirit and scope of the present disclosure. The n-type regions 212.1 through 212.k, the first n-type region 226.1 and the second n-type region 226.2 represent various regions within the intelligent n-diode 200 which include the n-type material. In an exemplary embodiment, the n-type regions 212.1 through 212.k, the first n-type region 226.1 and the second n-type region 226.2 include a heavy concentration of the n-type material, for example, approximately $$\frac{1 \times 10^{19}}{cm^3} \text{ to } \frac{5 \times 10^{20}}{cm^3},$$

to form N+ regions. In this exemplary embodiment, the "+" indicates the n-type regions 212.1 through 212.k, the first n-type region 226.1 and the second n-type region 226.2 include higher carrier concentrations than regions not designated by a "+," such as the n-well region 210 to provide an example. In this exemplary embodiment, for example, the "+" indicates n-type regions 212.1 through 212.k, the first n-type region 226.1 and the second n-type region 226.2 generally have a greater number of excess carrier electrons than the n-well region 210. In contrast, the p-type diode finger region 220 includes a p-type region 224. The p-region 224 represents a region within the intelligent n-diode 200 which includes the p-type material. In an exemplary embodiment, the p-type region 224 includes a heavy concentration of the p-type material, for example, approximately $$\frac{1 \times 10^{19}}{cm^3} \text{ to } \frac{5 \times 10^{20}}{cm^3},$$

to form a P+ region. In this exemplary embodiment, the "+" indicates the p-type region 224 includes higher carrier concentrations than regions not designated by a "+," such as the p-well region 234 to provide an example. For example, the p-type region 224 generally has a greater number of excess carrier holes than the p-well region 234. In the exemplary embodiment illustrated in FIG. 2, the first n-type region 226.1 and the second n-type region 226.2 form a cathode region of the intelligent n-diode 200 and the p-type region 224 forms an anode region of the intelligent n-diode 200.

As to be described in further detail below in FIG. 3, the n-type regions 212.1 through 212.k effectively reduce the quantity of carrier electrons, such as the carrier electrons 156 to provide an example, available within the semiconductor substrate 202 to reduce the likelihood of activating one or more parasitic structures within the other electrical, mechanical, and/or electro-mechanical circuitry coupled to the intelligent n-diode 200, such as the electronic circuitry 102 to provide an example. This reduction in the quantity of carrier electrons within the semiconductor substrate 202 similarly reduces the potential for latch-up of the other electrical, mechanical, and/or electro-mechanical circuitry.

In the exemplary embodiment illustrated in FIG. 2, the n-type electron absorption regions 208.1 through 208.k also include first STI regions 214.1 through 214.k and second STI regions 216.1 through 216.k. Similarly, the p-type diode finger region 220, the first n-type diode finger region 222.1, and the second n-type diode finger region 222.2 include first STI regions 228.1 through 228.3 and second STI regions 230.1 through 230.3. In an exemplary embodiment, the first STI regions 214.1 through 214.k, the second STI regions 216.1 through 216.k, the first STI regions 228.1 through 228.3 and the second STI regions 230.1 through 230.3 can include one or more dielectric materials, such as silicon dioxide ($SiO_2$) to provide an example, though any suitable dielectric material may be used that will be apparent to those skilled in the relevant art(s) without departing from the spirit and scope of the present disclosure. Although the first STI regions 214.1 through 214.k, the second STI regions 216.1 through 216.k, the first STI regions 228.1 through 228.3, and the second STI regions 230.1 through 230.3 are illustrated as being in shapes of rectangles in FIG. 2, this is for illustrative purposes only. Those skilled in the relevant art(s) will recognize that other shapes, for example having one or more linear segments and/or curved segments, are possible without departing from the spirit and scope of the present disclosure.

In the exemplary embodiment illustrated in FIG. 2, the n-type electron absorption regions 208.1 through 208.k further include silicide regions 218.1 through 218.k. Similarly, the p-type diode finger region 220, the first n-type diode finger region 222.1, and the second n-type diode finger region 222.2 include silicide regions 232.1 through 232.3. In an exemplary embodiment, the silicide regions 218.1 through 218.k and the silicide regions 232.1 through 232.3 include one or more alloys of metal and silicon, such as nickel silicide (NiSi), sodium silicide ($Na_2Si$), magnesium silicide ($Mg_2Si$), platinum silicide (PtSi), titanium silicide ($TiSi_2$), tungsten silicide ($WSi_2$), or molybdenum disilicide ($MoSi_2$) to provide some examples, though any suitable dielectric material may be used that will be apparent to those skilled in the relevant art(s) without departing from the spirit and scope of the present disclosure. Although the silicide regions 218.1 through 218.k and the silicide regions 232.1 through 232.3 are illustrated as being in shapes of rectangles in FIG. 2, this is for illustrative purposes only. Those skilled in the relevant art(s) will recognize that other shapes, for example having one or more linear segments and/or curved segments, are possible without departing from the spirit and scope of the present disclosure.

Exemplary Operation of the Exemplary Intelligent N-Diode

Figure 3:
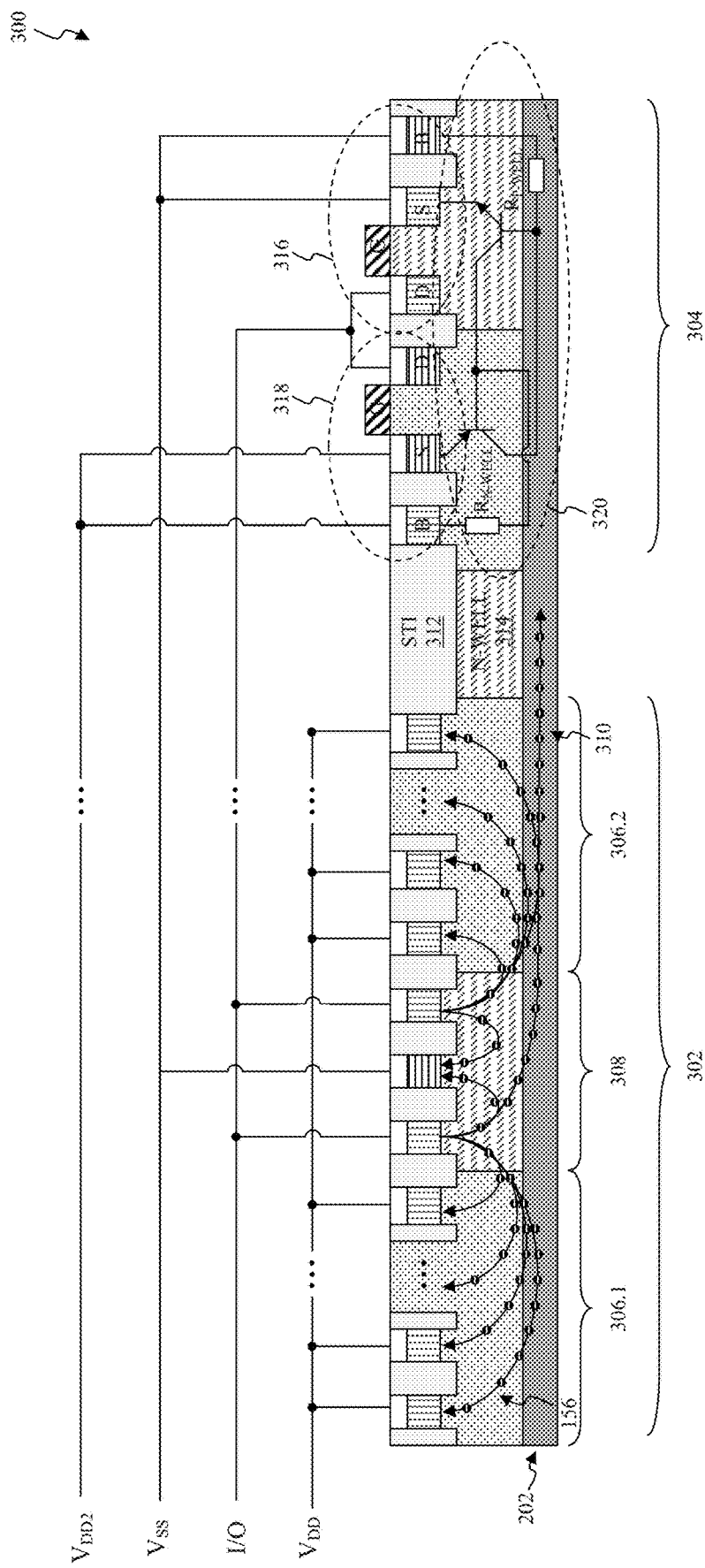
FIG. 3 illustrates a cross-sectional view of an integrated circuit having an exemplary embodiment of the exemplary intelligent n-diode according to an exemplary embodiment of the present disclosure.

FIG. 3 illustrates a cross-sectional view of an integrated circuit having an exemplary embodiment of the exemplary intelligent n-diode according to an exemplary embodiment of the present disclosure. An integrated circuit 300 can be situated within or onto the semiconductor substrate of a semiconductor layer stack in a substantially similar manner as the integrated circuit 100 as described above in FIG. 1. In the exemplary embodiment illustrated in FIG. 3, the integrated circuit 300 includes an intelligent n-diode 302 to effectively reduce the quantity of the carrier electrons 156 available within the semiconductor substrate 202 to reduce the likelihood of activating one or more parasitic structures within electronic circuitry 304 within the semiconductor substrate. This reduction in the quantity of carrier electrons within the semiconductor substrate 202 similarly reduces the potential for latch-up of the electronic circuitry 304.

As illustrated in FIG. 3, the intelligent n-diode 302 includes n-well strap regions 306.1 and 306.2 and a diode finger region 308. The intelligent n-diode 302 can represent an exemplary embodiment of intelligent n-diode 200. As such, the n-well strap regions 306.1 and 306.2 can represent exemplary embodiments of two n-well strap regions from among the n-well strap regions 204.1 through 204.m and the diode finger region 308 can represent an exemplary embodiment of a diode finger region from among the diode finger regions 206.1 through 206.i. As to be described below, the n-well strap regions 306.1 and 306.2 include the n-type electron absorption regions 208.1 through 208.k situated in the n-well region 210 as described above in FIG. 2. And, the diode finger region 308 includes the p-type diode finger region 220, the first n-type diode finger region 222.1 and the second n-type diode finger region 222.2 situated in the p-well region 234 as described above in FIG. 2.

In the exemplary embodiment illustrated in FIG. 3, the intelligent n-diode 302 dissipates one or more unwanted transient signals, such as the one or more unwanted transient signals 150 to provide an example, resulting from an electrostatic discharge event, such as the electrostatic discharge event 152. Ideally, the carrier electrons 156 traverse from the first n-type region 226.1 and the second n-type region 226.2 of the diode finger region 308 onto the p-type region 224 of the diode finger region 308. However, as described above in FIG. 1 and FIG. 2, some of the carrier electrons 156 from among the one or more unwanted transient signals flow from the intelligent n-diode 302 to the semiconductor substrate 202 as the intelligent n-diode 302 dissipates the one or more unwanted transient signals 150. For example, some carrier electrons from among the carrier electrons 156 traverse from the first n-type region 226.1 and the second n-type region 226.2 of the diode finger region 308 of the diode finger region 308 onto the electronic circuitry 304 and/or the n-well strap regions 306.1 and 306.2 as illustrated in FIG. 3. In the exemplary embodiment illustrated in FIG. 3, the carrier electrons 156 traversing from the first n-type region 226.1 and the second n-type region 226.2 of the diode finger region 308 of the diode finger region 308 onto the electronic circuitry 304 and/or the n-well strap regions 306.1 and 306.2 are captured by the n-type regions 212.1 through 212.k of the n-well strap regions 306.1 and 306.2. However, in some situations, carrier electrons 310 from among the carrier electrons 156 traversing from the first n-type region 226.1 and the second n-type region 226.2 of the diode finger region 308 are not captured by the n-type regions 212.1 through 212.k of the n-well strap regions 306.1 and 306.2 as illustrated in FIG. 3. In these situations, the carrier electrons 310 pass onto the electronic circuitry 304. The quantity of the carrier electrons 310 passing onto the electronic circuitry 304 is related to the number of n-type regions from among the n-type regions 212.1 through 212.k of the n-well strap regions 306.1 and 306.2. For example, more n-type regions from among the n-type regions 212.1 through 212.k of the n-well strap regions 306.1 and 306.2 lead to less carrier electrons 310 passing onto the electronic circuitry 304 and less n-type regions from among the n-type regions 212.1 through 212.k of the n-well strap regions 306.1 and 306.2 lead to more carrier electrons 310 passing onto the electronic circuitry 304. In the exemplary embodiment illustrated in FIG. 3, the first n-type region 226.1 and the second n-type region 226.2 form a cathode region of the intelligent n-diode 302 and the p-type region 224 forms an anode region of the intelligent n-diode 302.

In the exemplary embodiment illustrated in FIG. 3, the integrated circuit 300 includes an STI region 312 situated within a n-well region 314 within the semiconductor substrate to isolate the intelligent n-diode 302 from the electronic circuitry 304. In an exemplary embodiment, the STI region 312 can include substantially similar dielectric materials as the first STI regions 214.1 through 214.k and the second STI regions 216.1 through 216.k as described above in FIG. 2. In another exemplary embodiment, the n-well region 314 can include substantially similar n-type materials as the n-well region 210 as described above in FIG. 2.

As illustrated in FIG. 3, the electronic circuitry 304 includes an n-type metal oxide semiconductor (NMOS) device 316 and a p-type metal oxide semiconductor (PMOS) device 318 configured to form a logical inverting circuit. However, this configuration and arrangement of the electronic circuitry 304 as shown in FIG. 3 is for illustrative purposes only. Those skilled in the relevant art(s) will recognize other configurations and arrangements for the electronic circuitry 304 are possible without departing from the spirit and scope of the present disclosure. These other configurations and arrangements can include different NMOS and/or PMOS devices than illustrated in FIG. 3. In the exemplary embodiment illustrated in FIG. 3, the NMOS device 316 includes an p+ bulk (B) region (shown using horizontal lines in FIG. 3), n+ source (S) and drain (D) regions (shown using vertical lines in FIG. 3), and a gate (G) region (shown using diagonal lines in FIG. 3) within a p-well region (shown using the third gray shading, described above in FIG. 2, in FIG. 3). Likewise, the PMOS device 318 includes an n+ bulk (B) region (shown using vertical lines in FIG. 3), p+ source (S) and drain (D) regions (shown using horizontal lines in FIG. 3), and a gate (G) region (shown using diagonal lines in FIG. 3) within a n-well region (shown using the second gray shading, described above in FIG. 2, in FIG. 3).

Exemplary Intelligent P-Diode

Figure 4:
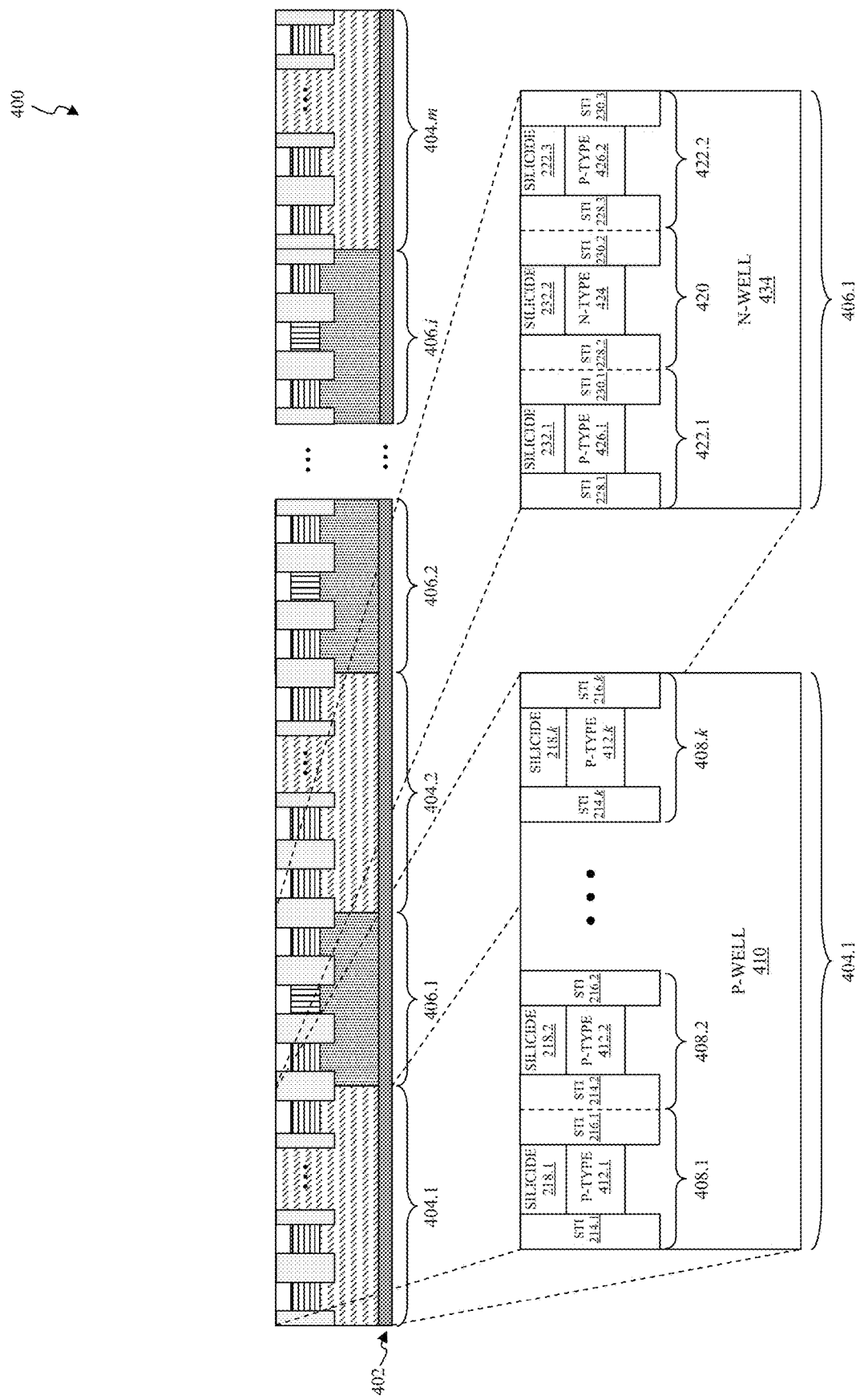
FIG. 4 illustrates a cross-sectional view of an exemplary intelligent p-diode according to an exemplary embodiment of the present disclosure.

FIG. 4 illustrates a cross-sectional view of an exemplary intelligent p-diode according to an exemplary embodiment of the present disclosure. An intelligent p-diode 400 can be situated within or onto the semiconductor substrate of a semiconductor layer stack in a substantially similar manner as the intelligent p-diode 110 as described above in FIG. 1. The intelligent p-diode 400 effectively reduces the quantity of carrier holes available within a semiconductor substrate 402 to reduce the likelihood of activating one or more parasitic structures within other electrical, mechanical, and/or electro-mechanical circuitry, such as the electronic circuitry 102, within the semiconductor substrate 402. This reduction in the quantity of carrier holes within the semiconductor substrate 402 similarly reduces the potential for latch-up of the other electrical, mechanical, and/or electro-mechanical circuitry. As illustrated in FIG. 4, the intelligent p-diode 400 includes p-well strap regions 404.1 through 404.m and diode finger regions 406.1 through 406.i. The intelligent p-diode 400 can be used to implement the intelligent p-diode 110 as described above.

As illustrated in FIG. 4, the p-well strap regions 404.1 through 404.m and the diode finger regions 406.1 through 406.i include n+ regions (shown using vertical lines in FIG. 4), p+ regions (shown using horizontal lines in FIG. 4), n-well regions (shown using a dotted shading in FIG. 4), p-well regions (shown a partial diagonal shading in FIG. 4), short trench isolation (STI) regions (shown a gray shading in FIG. 4), and silicide regions (shown using white shading in FIG. 4) situated within or onto the semiconductor substrate 402. In the exemplary embodiment illustrated in FIG. 4, the p-well strap regions 404.1 through 404.m are interdigitated with the diode finger regions 406.1 through 406.i to form the intelligent p-diode 400. In the exemplary embodiment illustrated in FIG. 4, the p-well strap regions 404.1 through 404.m are substantially similar to one another and the diode finger regions 406.1 through 406.i are substantially similar to one another; therefore, only the n-well strap region 404.1 from among the p-well strap regions 404.1 through 404.m and the diode finger region 406.1 from among the diode finger regions 406.1 through 406.i are described in further detail below. For ease of description, the shading of the various regions of the p-well strap region 404.1 and the diode finger region 406.1, as described above, are not illustrated in the exploded views of the p-well strap region 404.1 and the diode finger region 406.1. As illustrated in FIG. 4, the p-well strap region 404.1 includes p-type hole absorption regions 408.1 through 408.k situated in an p-well region 410. And the diode finger region 406.1 includes an n-type diode finger region 420, a first p-type diode finger region 422.1 and a second p-type diode finger region 422.2 situated in a n-well region 434.

The p-well region 410 represents an implanted n-type region within the semiconductor substrate 402 that includes one or more p-type materials. In an exemplary embodiment, the one or more p-type materials include impurity atoms of an acceptor type, such as boron (B), aluminum (Al), gallium (Ga) or any other suitable element, compound, or mixture that is capable of accepting holes that will be apparent to those skilled in the relevant art(s) without departing from the spirit and scope of the present disclosure. Similarly, the n-well region 434 represents an implanted p-type region within the semiconductor substrate 402 that includes one or more n-type materials. In an exemplary embodiment, the one or more n-type materials can include impurity atoms of a donor type, such as phosphorus (P), arsenic (As), antimony (Sb), or any other suitable element, compound, or mixture that is capable of donating holes that will be apparent to those skilled in the relevant art(s) without departing from the spirit and scope of the present disclosure.

In the exemplary embodiment illustrated in FIG. 4, the p-type hole absorption regions 408.1 through 408.k, the first p-type diode finger region 422.1, and the second p-type diode finger region 422.2 include p-type regions 412.1 through 412.k, a first p-type region 426.1, and a second p-type region 426.2, respectively. Although the p-type regions 412.1 through 412.k, the p-type region 224, the first p-type region 426.1 and the second p-type region 426.2 are illustrated as being in shapes of rectangles in FIG. 4, this is for illustrative purposes only. Those skilled in the relevant art(s) will recognize that other shapes, for example having one or more linear segments and/or curved segments, are possible without departing from the spirit and scope of the present disclosure. The p-type regions 412.1 through 412.k, the first p-type region 426.1 and the second p-type region 426.2 represent various regions within the intelligent p-diode 400 which include the p-type material. In an exemplary embodiment, the p-type regions 412.1 through 412.k, the first p-type region 426.1 and the second p-type region 426.2 include a heavy concentration of the p-type material, for example, approximately $$\frac{1 \times 10^{19}}{cm^3} \text{ to } \frac{5 \times 10^{20}}{cm^3},$$

to form P+ regions. In contrast, the n-type diode finger region 420 includes an n-type region 424. The n-type region 424 represents a region within the intelligent p-diode 400 which includes the n-type material. In an exemplary embodiment, the n-type region 424 includes a heavy concentration of the n-type material, for example, approximately $$\frac{1 \times 10^{19}}{cm^3} \text{ to } \frac{5 \times 10^{20}}{cm^3},$$

to form a N+ region. In the exemplary embodiment illustrated in FIG. 4, the first p-type region 426.1 and the second p-type region 426.2 form an anode region of the intelligent p-diode 400 and the n-type region 424 forms a cathode region of the intelligent p-diode 400.

As to be described in further detail below in FIG. 5, the p-type regions 412.1 through 412.k effectively reduce the quantity of carrier holes, such as the carrier holes 158 to provide an example, available within the semiconductor substrate 402 to reduce the likelihood of activating one or more parasitic structures within the other electrical, mechanical, and/or electro-mechanical circuitry coupled to the intelligent p-diode 400, such as the electronic circuitry 102 to provide an example. This reduction in the quantity of carrier holes within the semiconductor substrate 402 similarly reduces the potential for latch-up of the other electrical, mechanical, and/or electro-mechanical circuitry.

In the exemplary embodiment illustrated in FIG. 4, the p-type hole absorption regions 408.1 through 408.k also include the first STI regions 214.1 through 214.k, the second STI regions 216.1 through 216.k, and the silicide regions 218.1 through 218.k as described above in FIG. 2. Similarly, the n-type diode finger region 420, the first p-type diode finger region 422.1, and the second p-type diode finger region 422.2 include first STI regions 228.1 through 228.3 and second STI regions 230.1 through 230.3 as described above in FIG. 2. The n-type diode finger region 420, the first p-type diode finger region 422.1, and the second p-type diode finger region 422.2 also include the silicide regions 232.1 through 232.3 as described above in FIG. 2.

Exemplary Operation of the Exemplary Intelligent P-Diode

Figure 5:
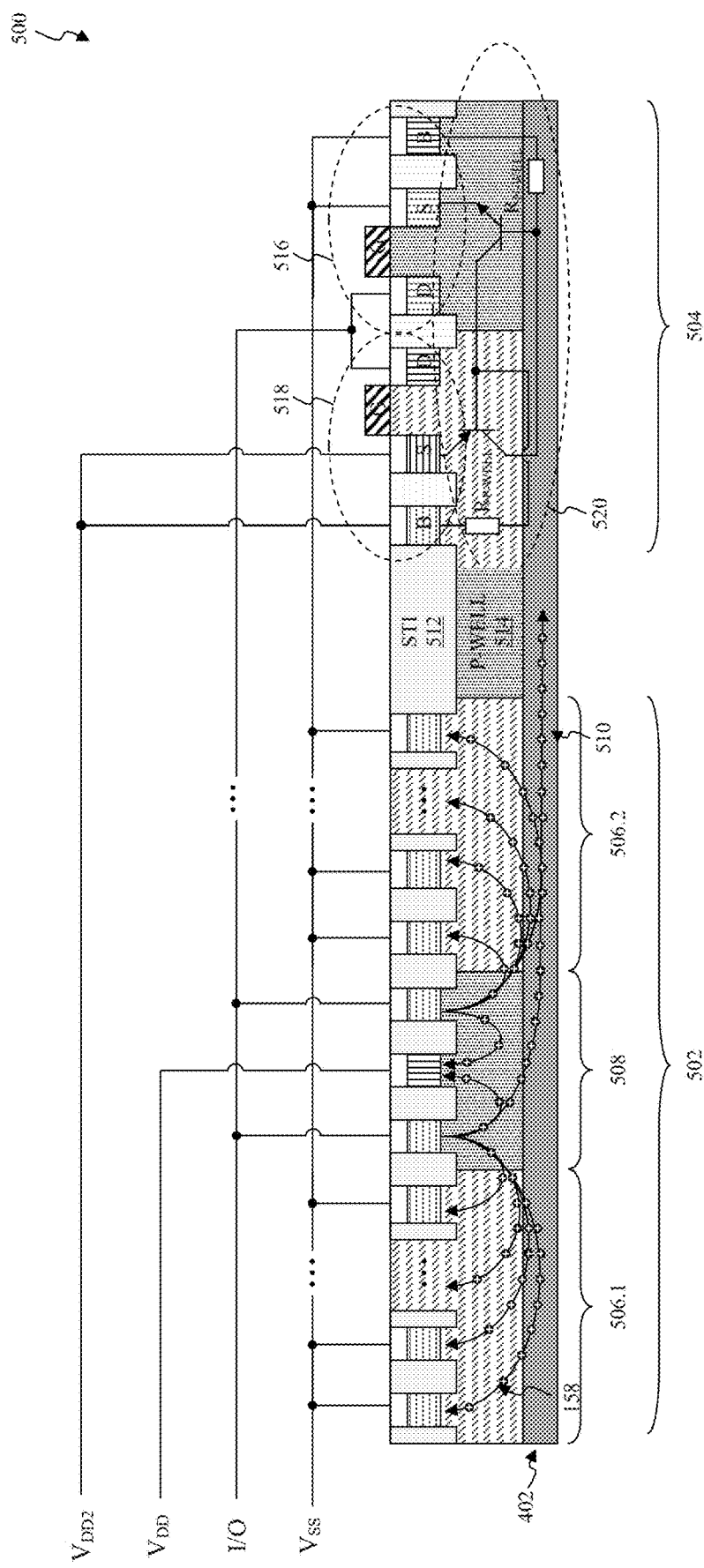
FIG. 5 illustrates a cross-sectional view of an integrated circuit having an exemplary embodiment of the exemplary intelligent p-diode according to an exemplary embodiment of the present disclosure.

FIG. 5 illustrates a cross-sectional view of an integrated circuit having an exemplary embodiment of the exemplary intelligent p-diode according to an exemplary embodiment of the present disclosure. An integrated circuit 500 can be situated within or onto the semiconductor substrate of a semiconductor layer stack in a substantially similar manner as the integrated circuit 100 as described above in FIG. 1. In the exemplary embodiment illustrated in FIG. 5, the integrated circuit 500 includes an intelligent p-diode 502 to effectively reduce the quantity of the carrier holes 158 available within the semiconductor substrate 402 to reduce the likelihood of activating one or more parasitic structures within electronic circuitry 504 within the semiconductor substrate. This reduction in the quantity of carrier holes 158 within the semiconductor substrate 402 similarly reduces the potential for latch-up of the electronic circuitry 504.

As illustrated in FIG. 5, the intelligent p-diode 502 includes p-well strap regions 506.1 and 506.2 and a diode finger region 508. The intelligent p-diode 502 can represent an exemplary embodiment of intelligent p-diode 400 as described above in FIG. 4. As such, the p-well strap regions 506.1 and 506.2 can represent exemplary embodiments of two p-well strap regions from among the p-well strap regions 404.1 through 404.m and the diode finger region 508 can represent an exemplary embodiment of a diode finger region from among the diode finger regions 406.1 through 406.i. As to be described below, the p-well strap regions 506.1 and 506.2 include the p-type hole absorption regions 408.1 through 408.k situated in the p-well region 410 as described above in FIG. 4. And, the diode finger region 508 includes the n-type diode finger region 420, the first p-type diode finger region 422.1 and the second p-type diode finger region 422.2 situated in the n-well region 434 as described above in FIG. 4.

In the exemplary embodiment illustrated in FIG. 5, the intelligent p-diode 502 dissipates one or more unwanted transient signals, such as the one or more unwanted transient signals 150 to provide an example, resulting from an electrostatic discharge event, such as the electrostatic discharge event 152. Ideally, the carrier holes 158 traverse from the first p-type region 426.1 and the second p-type region 426.2 of the diode finger region 508 onto the n-type region 424 of the diode finger region 508. However, as described above in FIG. 1 and FIG. 4, some of the carrier holes 158 from among the one or more unwanted transient signals flow from the intelligent p-diode 502 to the semiconductor substrate 402 as the intelligent p-diode 502 dissipates the one or more unwanted transient signals 150. For example, some carrier holes from among the carrier holes 158 traverse from the first p-type region 426.1 and the second p-type region 426.2 of the diode finger region 508 onto the electronic circuitry 504 and/or the p-well strap regions 506.1 and 506.2 as illustrated in FIG. 5. In the exemplary embodiment illustrated in FIG. 5, the carrier holes 158 traversing from the first p-type region 426.1 and the second p-type region 426.2 of the diode finger region 508 onto the electronic circuitry 504 and/or the p-well strap regions 506.1 and 506.2 are captured by the p-type regions 412.1 through 412.k of the p-well strap regions 506.1 and 506.2. However, in some situations, carrier holes 510 from among the carrier holes 158 traversing from the first p-type region 426.1 and the second p-type region 426.2 of the diode finger region 508 are not captured by the p-type regions 412.1 through 412.k of the p-well strap regions 506.1 and 506.2 as illustrated in FIG. 5. In these situations, the carrier holes 510 pass onto the electronic circuitry 504. The quantity of the carrier holes 510 passing onto the electronic circuitry 504 is related to the number of p-type regions from among the p-type regions 412.1 through 412.k of the p-well strap regions 506.1 and 506.2. For example, more p-type regions from among the p-type regions 412.1 through 412.k of the p-well strap regions 506.1 and 506.2 lead to less carrier holes 510 passing onto the electronic circuitry 504 and less p-type regions from among the p-type regions 412.1 through 412.k of the p-well strap regions 506.1 and 506.2 lead to more carrier holes 510 passing onto the electronic circuitry 504.

In the exemplary embodiment illustrated in FIG. 5, the integrated circuit 500 includes an STI region 512 situated within a p-well region 514 within the semiconductor substrate to isolate the intelligent p-diode 502 from the electronic circuitry 504. In an exemplary embodiment, the STI region 512 can include substantially similar dielectric materials as the first STI regions 414.1 through 414.k and the second STI regions 416.1 through 416.k as described above in FIG. 4. In another exemplary embodiment, the p-well region 514 can include substantially similar p-type materials as the p-well region 410 as described above in FIG. 4.

As illustrated in FIG. 5, the electronic circuitry 504 includes a p-type metal oxide semiconductor (PMOS) device 516 and an n-type metal oxide semiconductor (NMOS) device 718 configured to form a logical inverting circuit. However, this configuration and arrangement of the electronic circuitry 504 as shown in FIG. 5 is for illustrative purposes only. Those skilled in the relevant art(s) will recognize other configurations and arrangements for the electronic circuitry 504 are possible without departing from the spirit and scope of the present disclosure. These other configurations and arrangements can include different NMOS and/or PMOS devices than illustrated in FIG. 5. In the exemplary embodiment illustrated in FIG. 5, the PMOS device 516 includes an p+ bulk (B) region (shown using horizontal lines in FIG. 5), n+ source (S) and drain (D) regions (shown using vertical lines in FIG. 5), and a gate (G) region (shown using diagonal lines in FIG. 5) within a p-well region (shown using the third gray shading, described above in FIG. 4, in FIG. 5). Likewise, the NMOS device 318 includes an n+ bulk (B) region (shown using vertical lines in FIG. 5), p+ source (S) and drain (D) regions (shown using horizontal lines in FIG. 5), and a gate (G) region (shown using diagonal lines in FIG. 5) within a n-well region (shown using the second gray shading, described above in FIG. 4).

Exemplary Intelligent Dual Diodes

Figure 6:
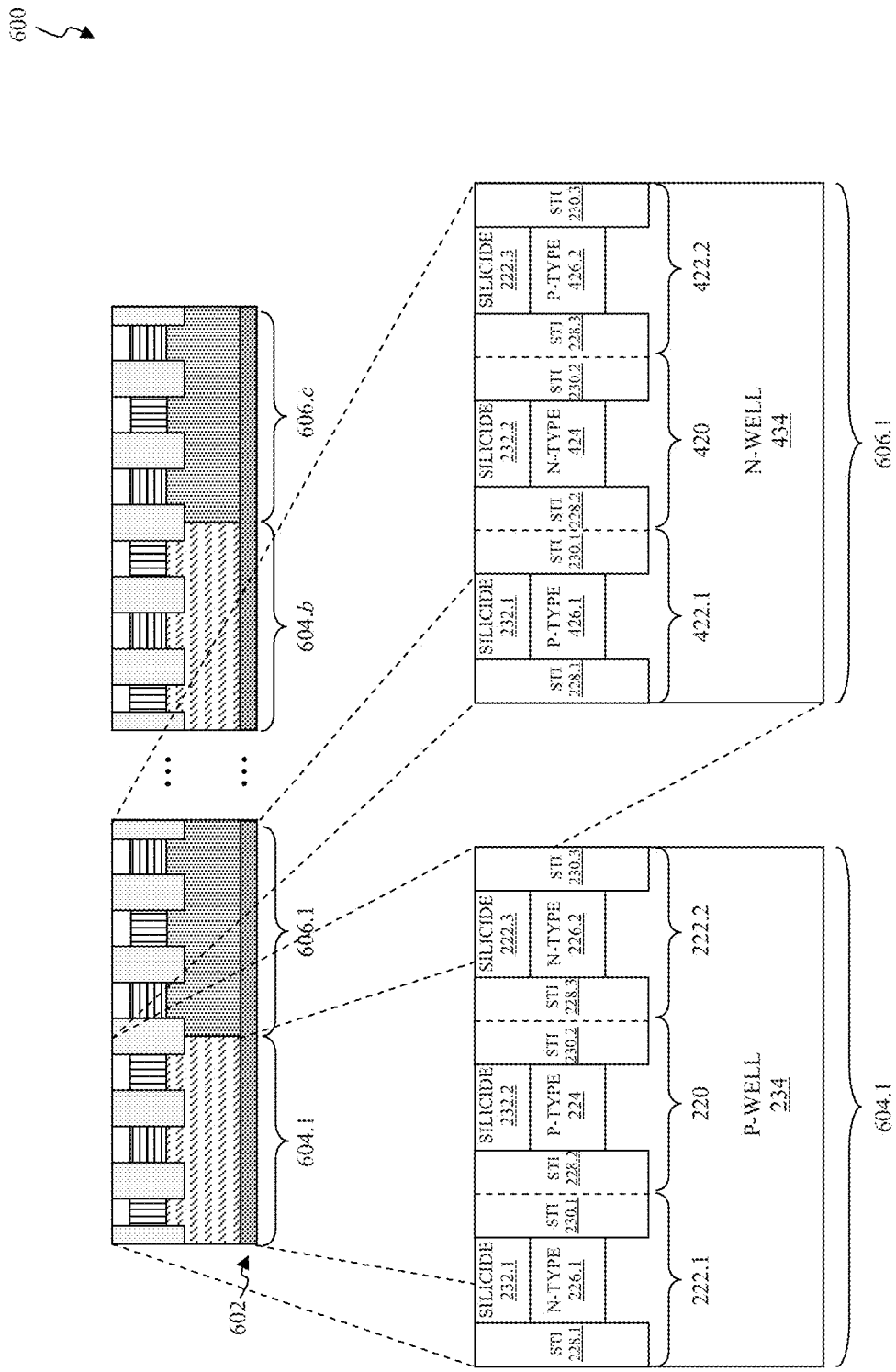
FIG. 6 illustrates a cross-sectional view of a first exemplary intelligent dual diode according to an exemplary embodiment of the present disclosure.

FIG. 6 illustrates a cross-sectional view of a first exemplary intelligent dual diode according to an exemplary embodiment of the present disclosure. An intelligent dual diode 600 can be situated within or onto the semiconductor substrate of a semiconductor layer stack in a substantially similar manner as the intelligent n-diode 108 and the intelligent p-diode 110 as described above in FIG. 1. The intelligent dual diode 600 effectively reduces the quantity of carrier electrons and/or carrier holes available within a semiconductor substrate 602 to reduce the likelihood of activating one or more parasitic structures within other electrical, mechanical, and/or electro-mechanical circuitry, such as the electronic circuitry 102, within the semiconductor substrate 602. This reduction in the quantity of carrier electrons and/or carrier holes within the semiconductor substrate 602 similarly reduces the potential for latch-up of the other electrical, mechanical, and/or electro-mechanical circuitry. As illustrated in FIG. 6, the intelligent dual diode 600 includes diode finger regions 604.1 through 604.b and diode finger regions 606.1 through 606.c. The intelligent dual diode 600 can be used to implement the intelligent n-diode 108 and the intelligent p-diode 110 as described above.

As illustrated in FIG. 6, the diode finger regions 604.1 through 604.b and the diode finger regions 606.1 through 606.c include n+ regions (shown using vertical lines in FIG. 6), p+ regions (shown using horizontal lines in FIG. 6), n-well regions (shown using a dotted shading in FIG. 6), p-well regions (shown a partial diagonal shading in FIG. 6), short trench isolation (STI) regions (shown a gray shading in FIG. 6), and silicide regions (shown using white shading in FIG. 6) situated within or onto the semiconductor substrate 602. In the exemplary embodiment illustrated in FIG. 6, the diode finger regions 604.1 through 604.b are interdigitated with the diode finger regions 606.1 through 606.c to form the intelligent dual diode 600. In the exemplary embodiment illustrated in FIG. 6, the diode finger regions 604.1 through 604.b are substantially similar to one another and the diode finger regions 606.1 through 606.c are substantially similar to one another; therefore, only the diode finger region 604.1 from among the diode finger regions 604.1 through 604.b and the diode finger region 606.1 from among the diode finger regions 606.1 through 606.c are described in further detail below. For ease of description, the shading of the various regions of the diode finger region 604.1 and the diode finger region 606.1, as described above, are not illustrated in the exploded views of the diode finger region 604.1 and the diode finger region 606.1.

As illustrated in FIG. 6, the diode finger region 604.1 can represent an exemplary embodiment of the diode finger region 206.1 as described above in FIG. 2. In this exemplary embodiment, the diode finger region 604.1 includes the p-type diode finger region 220, the first n-type diode finger region 222.1 and the second n-type diode finger region 222.2 situated in the p-well region 234. Each of these regions has been described above in FIG. 2 and will not be described in further detail. Similarly in this exemplary embodiment, the diode finger region 606.1 can represent an exemplary embodiment of the diode finger region 406.1 as described above in FIG. 4. In this exemplary embodiment, the diode finger region 606.1 includes the n-type diode finger region 420, the first p-type diode finger region 422.1, and the second p-type diode finger region 422.2 situated in a n-well region 434. Each of these regions has been described above in FIG. 4 and will not be described in further detail.

Exemplary Operations of the Exemplary Intelligent P-Diode

Figure 7:
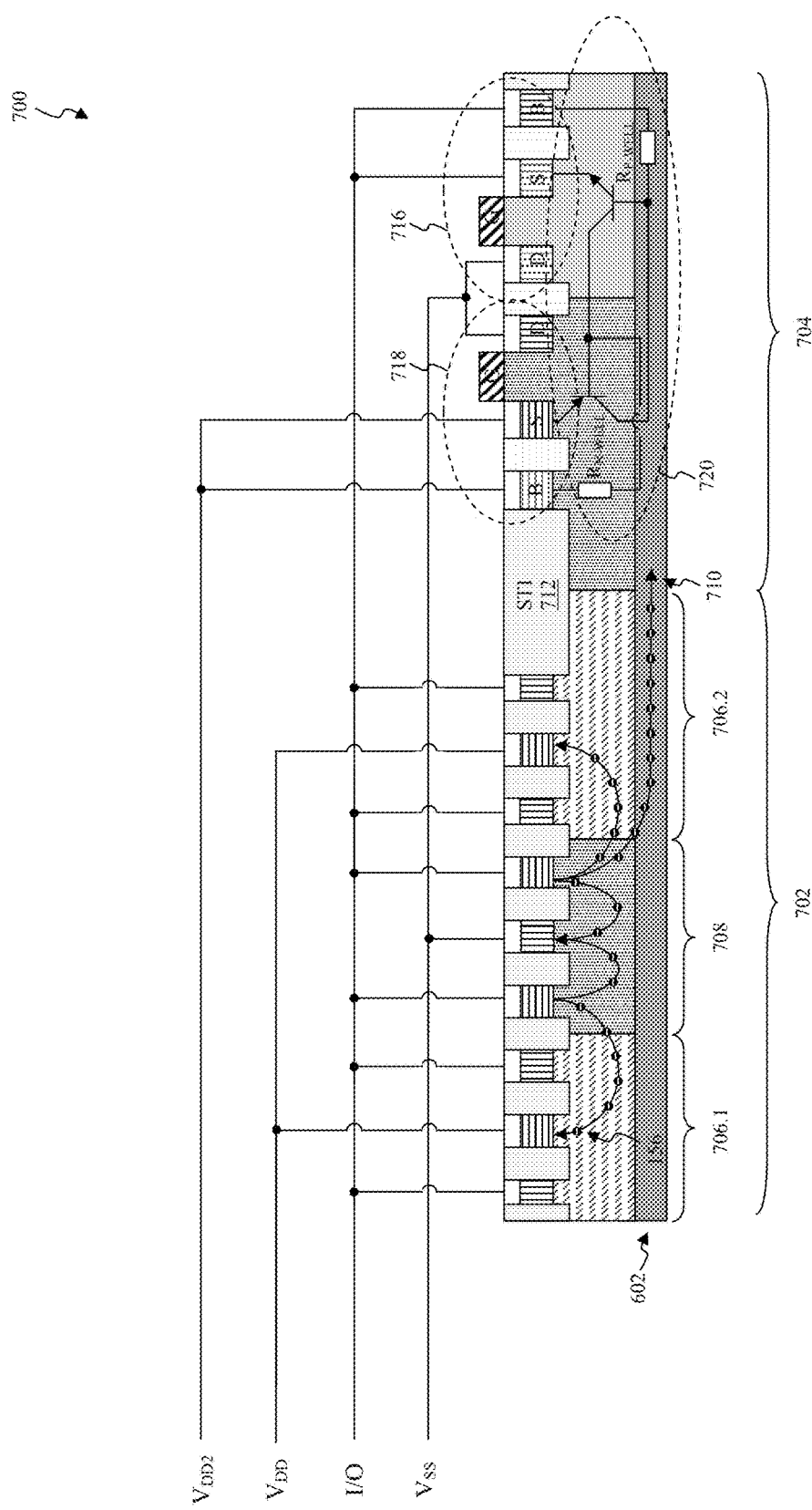
FIG. 7 illustrates a first cross-sectional view of an integrated circuit having an exemplary embodiment of the first exemplary intelligent dual diode according to an exemplary embodiment of the present disclosure.

FIG. 7 illustrates a first cross-sectional view of an integrated circuit having an exemplary embodiment of the first exemplary intelligent dual diode according to an exemplary embodiment of the present disclosure. An integrated circuit 700 can be situated within or onto the semiconductor substrate of a semiconductor layer stack in a substantially similar manner as the integrated circuit 100 as described above in FIG. 1. In the exemplary embodiment illustrated in FIG. 7, the integrated circuit 700 includes an intelligent dual diode 702 to effectively reduce the quantity of the carrier electrons 156 available within the semiconductor substrate 602 to reduce the likelihood of activating one or more parasitic structures within electronic circuitry 704 within the semiconductor substrate. This reduction in the quantity of carrier electrons 156 within the semiconductor substrate 602 similarly reduces the potential for latch-up of the electronic circuitry 704.

As illustrated in FIG. 7, the intelligent dual diode 702 includes diode finger regions 706.1 and 706.2 and a diode finger region 708. The intelligent dual diode 702 can represent an exemplary embodiment of intelligent dual diode 600 as described above in FIG. 6. As such, the diode finger regions 706.1 and 706.2 can represent exemplary embodiments of two diode finger regions from among the diode finger regions 604.1 through 604.b and the diode finger region 708 can represent an exemplary embodiment of a diode finger region from among the diode finger regions 606.1 through 606.c. As to be described below, the diode finger regions 706.1 and 706.2 include the p-type diode finger region 220, the first n-type diode finger region 222.1, and the second n-type diode finger region 222.2 situated in the p-well region 234 as described above in FIG. 6. And, the diode finger region 708 includes the n-type diode finger region 420, the first p-type diode finger region 422.1, and the second p-type diode finger region 422.2 situated in the n-well region 434 as described above in FIG. 6.

In the exemplary embodiment illustrated in FIG. 7, the intelligent dual diode 702 dissipates one or more unwanted transient signals, such as the one or more unwanted transient signals 150 to provide an example, resulting from an electrostatic discharge event, such as the electrostatic discharge event 152. Ideally, the carrier electrons 156 traverse from the first p-type diode finger region 422.1 and the second p-type diode finger region 422.2 of the diode finger region 708 onto the n-type diode finger region 420 of the diode finger region 708. However, as described above in FIG. 1 and FIG. 6, some of the carrier electrons 156 from among the one or more unwanted transient signals flow from the intelligent dual diode 702 to the semiconductor substrate 602 as the intelligent dual diode 702 dissipates the one or more unwanted transient signals 150. For example, some carrier electrons from among the carrier electrons 156 traverse from the first p-type diode finger region 422.1 and the second p-type diode finger region 422.2 of the diode finger region 708 onto the electronic circuitry 704 as illustrated in FIG. 7. In the exemplary embodiment illustrated in FIG. 7, the carrier electrons 156 traversing from the first p-type diode finger region 422.1 and the second p-type diode finger region 422.2 of the diode finger region 708 onto the electronic circuitry 704 are captured by the p-type diode finger region 220 of the diode finger regions 706.1 and 706.2. However, in some situations, carrier electrons 710 from among the carrier electrons 156 traversing from the first p-type diode finger region 422.1 and the p-type diode finger region 220 of the diode finger regions 706.1 and 706.2 as illustrated in FIG. 7. In these situations, the carrier electrons 710 pass onto the electronic circuitry 704. The quantity of the carrier electrons 710 passing onto the electronic circuitry 704 is related to the number of the diode finger regions 706.1 and 706.2. For example, more diode finger regions 706.1 and 706.2 lead to less carrier electrons 710 passing onto the electronic circuitry 704 and less diode finger regions 706.1 and 706.2 lead to more carrier electrons 710 passing onto the electronic circuitry 704.

In the exemplary embodiment illustrated in FIG. 7, the integrated circuit 700 includes an STI region 712 to isolate the intelligent dual diode 702 from the electronic circuitry 704. In an exemplary embodiment, the STI region 512 can include substantially similar dielectric materials as the first STI regions 228.1 through 228.3 and the second STI regions 230.1 through 230.3 as described above in FIG. 6.

As illustrated in FIG. 7, the electronic circuitry 704 includes a p-type metal oxide semiconductor (PMOS) device 518 and an n-type metal oxide semiconductor (NMOS) device 718 configured to form a logical inverting circuit. However, this configuration and arrangement of the electronic circuitry 704 as shown in FIG. 7 is for illustrative purposes only. Those skilled in the relevant art(s) will recognize other configurations and arrangements for the electronic circuitry 704 are possible without departing from the spirit and scope of the present disclosure. These other configurations and arrangements can include different NMOS and/or PMOS devices than illustrated in FIG. 7. In the exemplary embodiment illustrated in FIG. 7, the PMOS device 516 includes an p+ bulk (B) region (shown using horizontal lines in FIG. 7), n+ source (S) and drain (D) regions (shown using vertical lines in FIG. 7), and a gate (G) region (shown using diagonal lines in FIG. 7) within a p-well region (shown using the third gray shading, described above in FIG. 4, in FIG. 7). Likewise, the NMOS device 318 includes an n+ bulk (B) region (shown using vertical lines in FIG. 7), p+ source (S) and drain (D) regions (shown using horizontal lines in FIG. 7), and a gate (G) region (shown using diagonal lines in FIG. 7) within a n-well region (shown using the second gray shading, described above in FIG. 4).

Figure 8:
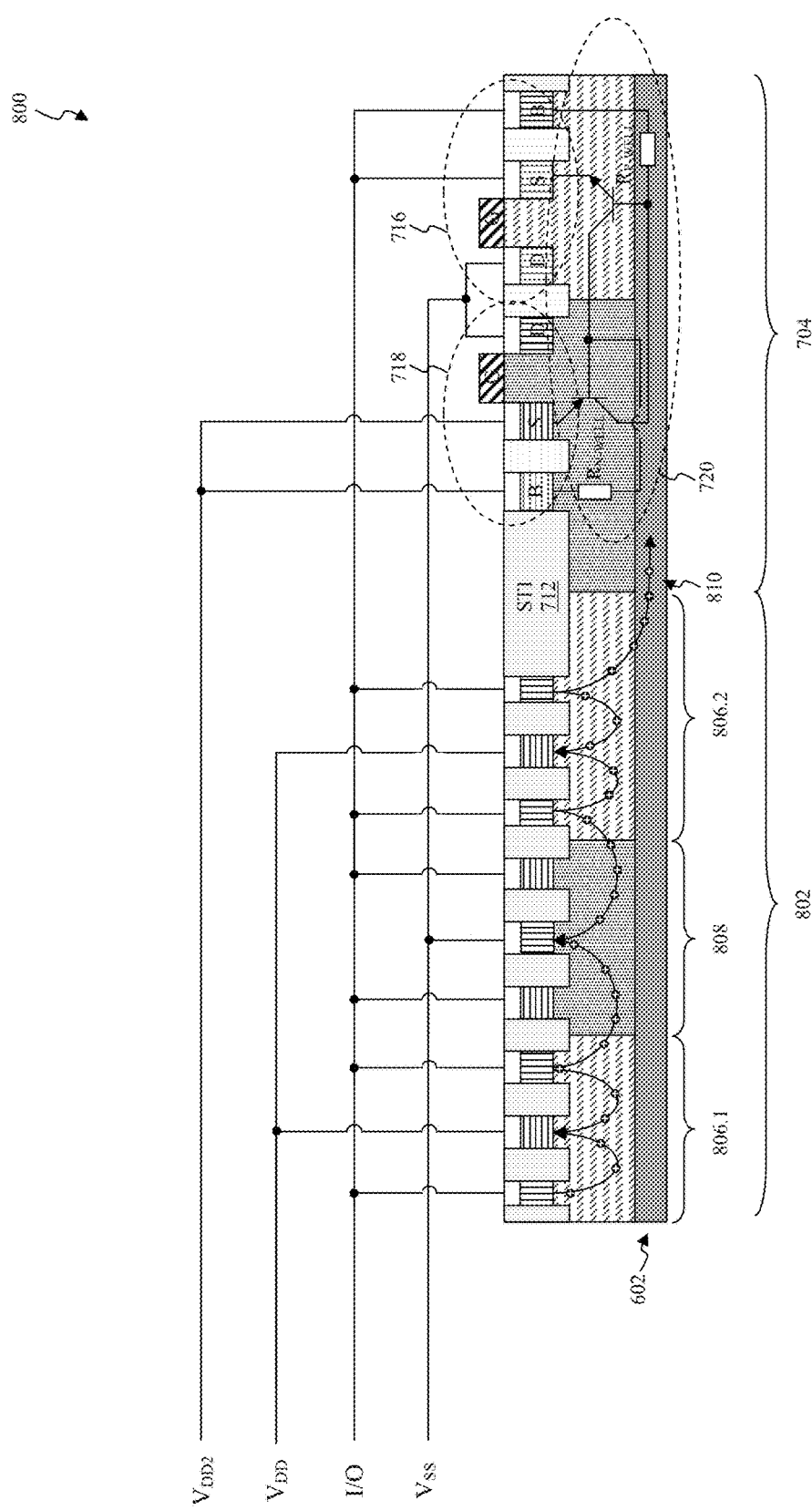
FIG. 8 illustrates a second cross-sectional view of an integrated circuit having an exemplary embodiment of the first exemplary intelligent dual diode according to an exemplary embodiment of the present disclosure.

FIG. 8 illustrates a second cross-sectional view of an integrated circuit having an exemplary embodiment of the first exemplary intelligent dual diode according to an exemplary embodiment of the present disclosure. An integrated circuit 800 can be situated within or onto the semiconductor substrate of a semiconductor layer stack in a substantially similar manner as the integrated circuit 100 as described above in FIG. 1. In the exemplary embodiment illustrated in FIG. 8, the integrated circuit 800 includes an intelligent dual diode 802 to effectively reduce the quantity of the carrier holes 158 available within the semiconductor substrate 602 to reduce the likelihood of activating one or more parasitic structures within the electronic circuitry 704 within the semiconductor substrate. This reduction in the quantity of carrier holes 158 within the semiconductor substrate 602 similarly reduces the potential for latch-up of the electronic circuitry 704.

As illustrated in FIG. 8, the intelligent dual diode 802 includes diode finger regions 806.1 and 806.2 and a diode finger region 808. The intelligent dual diode 802 can represent an exemplary embodiment of intelligent dual diode 600 as described above in FIG. 6. As such, the diode finger regions 806.1 and 806.2 can represent exemplary embodiments of two diode finger regions from among the diode finger regions 604.1 through 604.b and the diode finger region 808 can represent an exemplary embodiment of a diode finger region from among the diode finger regions 606.1 through 606.c. As to be described below, the diode finger regions 806.1 and 806.2 include the p-type diode finger region 220, the first n-type diode finger region 222.1, and the second n-type diode finger region 222.2 situated in the p-well region 234 as described above in FIG. 6. And, the diode finger region 808 includes the n-type diode finger region 420, the first p-type diode finger region 422.1, and the second p-type diode finger region 422.2 situated in the n-well region 434 as described above in FIG. 6.

In the exemplary embodiment illustrated in FIG. 8, the intelligent dual diode 802 dissipates one or more unwanted transient signals, such as the one or more unwanted transient signals 150 to provide an example, resulting from an electrostatic discharge event, such as the electrostatic discharge event 152. Ideally, the carrier holes 158 traverse from the first n-type diode finger region 222.1 and the second n-type diode finger region 222.2 of the diode finger regions 806.1 and 806.2 onto the p-type diode finger region 220 of the diode finger regions 806.1 and 806.2. However, as described above in FIG. 1 and FIG. 6, some of the carrier holes 158 from among the one or more unwanted transient signals flow from the intelligent dual diode 802 to the semiconductor substrate 602 as the intelligent dual diode 802 dissipates the one or more unwanted transient signals 150. For example, some carrier electrons from among the carrier holes 158 traverse from the first n-type diode finger region 222.1 and the second n-type diode finger region 222.2 of the diode finger regions 806.1 and 806.2 onto the electronic circuitry 704 as illustrated in FIG. 8. In the exemplary embodiment illustrated in FIG. 8, the carrier holes 158 traversing from the first n-type diode finger region 222.1 and the second n-type diode finger region 222.2 of the diode finger regions 806.1 and 806.2 of the diode finger region 808 onto the electronic circuitry 704 are captured by the n-type diode finger region 420 of the diode finger region 808. However, in some situations, carrier holes 810 from among the carrier holes 158 traverse from the first p-type diode finger region 422.1 and the p-type diode finger region 220 of the diode finger regions 806.1 and 806.2 as illustrated in FIG. 8. In these situations, the carrier holes 810 pass onto the electronic circuitry 704. The quantity of the carrier holes 810 passing onto the electronic circuitry 704 is related to the number of the diode finger regions 808. For example, more diode finger regions 808 lead to less carrier holes 810 passing onto the electronic circuitry 704 and less diode finger regions 808 lead to more carrier holes 810 passing onto the electronic circuitry 704.

Non-Planar Implementations for the Exemplary Intelligent Diodes

Figure 9:
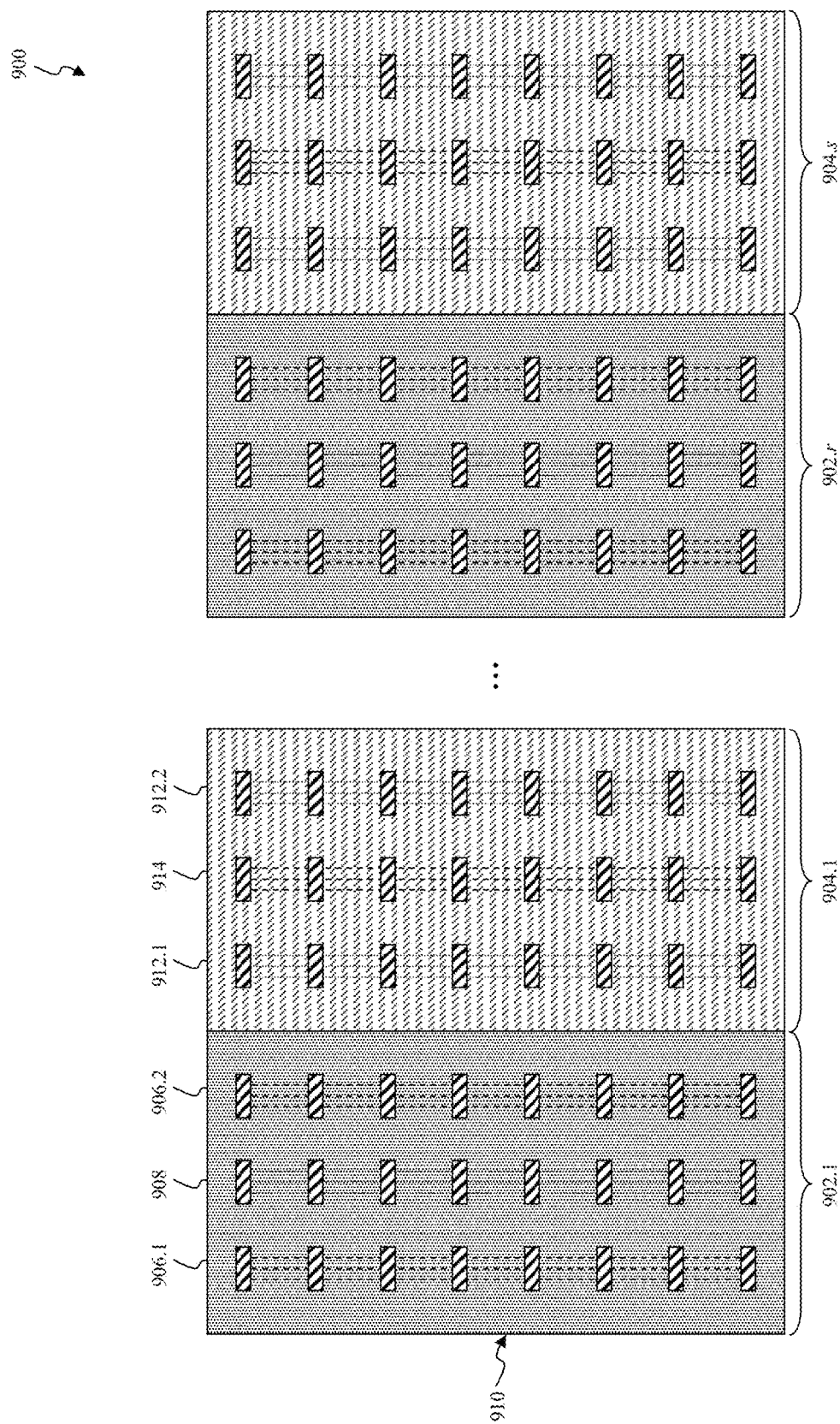
FIG. 9 illustrates a cross-sectional view of a second exemplary intelligent dual diode according to an exemplary embodiment of the present disclosure.

Although FIG. 2 through FIG. 8 have been described the intelligent n-diode 200, the intelligent n-diode 302, the intelligent p-diode 400, the intelligent p-diode 502, and the intelligent dual diode 600, the intelligent dual diode 702, and the intelligent dual diode 802 as being planar structures, those skilled in the relevant art(s) will recognize the teachings herein are applicable to other non-planar structures, such as FinFETs (fin field-effect transistors) to provide an example, without departing from the spirit and scope of the present disclosure. For example, FIG. 9 illustrates a top-down view of a second exemplary intelligent dual diode according to an exemplary embodiment of the present disclosure. An intelligent dual diode 900 can be situated within or onto the semiconductor substrate of a semiconductor layer stack in a substantially similar manner as the intelligent n-diode 108 and the intelligent p-diode 110 as described above in FIG. 1. The intelligent dual diode 900 effectively reduces the quantity of carrier electrons and/or carrier holes available within the semiconductor substrate to reduce the likelihood of activating one or more parasitic structures within other electrical, mechanical, and/or electro-mechanical circuitry, such as the electronic circuitry 102, within the semiconductor substrate. This reduction in the quantity of carrier electrons and/or carrier holes within the semiconductor substrate similarly reduces the potential for latch-up of the other electrical, mechanical, and/or electro-mechanical circuitry. As illustrated in FIG. 9, the intelligent dual diode 900 includes diode finger regions 902.1 through 902.r and diode finger regions 904.1 through 904.s. The intelligent dual diode 900 can be used to implement the intelligent n-diode 108 and the intelligent p-diode 110 as described above.

As illustrated in FIG. 9, the diode finger regions 902.1 through 902.r and the diode finger regions 904.1 through 904.s include n-well regions (shown using a dotted shading in FIG. 2) and p-well regions (shown a partial diagonal shading in FIG. 2) situated within or onto the semiconductor substrate. In the exemplary embodiment illustrated in FIG. 9, the diode finger regions 902.1 through 902.r are interdigitated with the diode finger regions 904.1 through 904.s to form the intelligent dual diode 900. In the exemplary embodiment illustrated in FIG. 9, the diode finger regions 902.1 through 902.r are substantially similar to one another and the diode finger regions 904.1 through 904.s are substantially similar to one another; therefore, only the diode finger region 902.1 from among the diode finger regions 902.1 through 902.r and the diode finger region 904.1 from among the diode finger regions 904.1 through 904.s are described in further detail below.

In the exemplary embodiment illustrated in FIG. 9, the diode finger region 902.1 includes a first n-type FinFET 906.1, a second n-type FinFET 906.2, and a p-type FinFET 908. As illustrated in FIG. 9, the first n-type FinFET 906.1 and the second n-type FinFET 906.2 include one or more fin regions (shown using dashed lines in FIG. 9) and one or more gate regions (shown using diagonal lines in FIG. 9) within an n-well region 910 (shown using dotted shading in FIG. 9). Similarly, the p-type FinFET 908 includes one or more fin regions (shown using dotted lines in FIG. 9) and one or more gate regions within the n-well region 910. For ease of description, the first n-type FinFET 906.1, the second n-type FinFET 906.2, and the p-type FinFET 908 include one or more source regions and one or more drain regions which are not illustrated in FIG. 9.

Additionally, the diode finger region 904.1 includes a first p-type FinFET 912.1, a second p-type FinFET 912.2, and a n-type FinFET 914 in the exemplary embodiment illustrated in FIG. 9. As illustrated in FIG. 9, the first p-type FinFET 912.1 and the second p-type FinFET 912.2 include one or more fin regions and one or more gate regions within an p-well region 916 (shown using gray shading in FIG. 9). Similarly, the n-type FinFET 914 includes one or more fin regions and one or more gate regions within the n-well region 910. For ease of description, the first p-type FinFET 912.1, the second p-type FinFET 912.2, and the n-type FinFET 914 include one or more source regions and one or more drain regions which are not illustrated in FIG. 9.

CONCLUSION

The foregoing Detailed Description discloses an intelligent diode. The intelligent diode includes multiple finger regions interdigitated with multiple strap regions. Each of the multiple finger regions includes: a first well region of a first type of material, a first finger region of the first type of material situated in the first well region, and a second finger region and a third finger region of a second type of material different from the first type of material, the second finger region and the third finger region being situated within the first well region. Each of the multiple strap regions includes a second well region of the second type of material, multiple absorption regions of the second type of material situated in the second well region, and multiple shallow trench isolation (STI) regions interdigitated with the multiple absorption regions, the multiple of STI regions being situated within the second well region.

The foregoing Detailed Description discloses another intelligent diode. This other intelligent diode includes multiple first diode finger regions and multiple second diode finger regions interdigitated with the multiple first diode finger regions. Each diode finger region from among the multiple first diode finger regions includes: a first well region of a first type of material, a first finger region of the first type of material situated in the first well region, a second finger region and a third finger region of a second type of material different from the first type of material, the second finger region and the third finger region being situated within the first well region. Each diode finger region from among the second multiple diode finger regions including: a second well region of the second type of material, a fourth finger region of the second type of material situated in the first well region, a fifth finger region and a sixth finger region of the first type of material, the second finger region and the third finger region being situated within the second well region.

The foregoing Detailed Description further discloses an integrated circuit having a semiconductor substrate and an intelligent diode situated within or onto the semiconductor substrate. The intelligent diode including multiple first regions interdigitated with multiple second regions, the multiple second regions being configured to collect carrier electrons or carrier holes flowing through the semiconductor substrate in response to the multiple first regions dissipating a transient signal generated in response to an electrostatic discharge event.

The foregoing Detailed Description referred to accompanying figures to illustrate exemplary embodiments consistent with the disclosure. References in the foregoing Detailed Description to "an exemplary embodiment" indicates that the exemplary embodiment described can include a particular feature, structure, or characteristic, but every exemplary embodiment may not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The foregoing Detailed Description is not meant to limiting. Rather, the scope of the disclosure is defined only in accordance with the following claims and their equivalents. It is to be appreciated that the foregoing Detailed Description, and not the following Abstract section, is intended to be used to interpret the claims. The Abstract section can set forth one or more, but not all exemplary embodiments, of the disclosure, and thus, is not intended to limit the disclosure and the following claims and their equivalents in any way.

The exemplary embodiments described within foregoing Detailed Description have been provided for illustrative purposes, and are not intended to be limiting. Other exemplary embodiments are possible, and modifications can be made to the exemplary embodiments while remaining within the spirit and scope of the disclosure. The foregoing Detailed Description has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing circuitry). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The foregoing Detailed Description fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. A diode, comprising:
a plurality of diode finger regions, each diode finger region of the plurality of diode finger regions comprising:
a first well region of a first type of material,
a first finger region of the first type of material situated in the first well region, and
a second finger region of a second type of material, different from the first type of material, situated in the first well region; and
a plurality of strap regions interdigitated with the plurality of diode finger regions, each strap region of the plurality of strap regions comprising:
a second well region of the second type of material, and
a plurality of absorption regions of the second type of material situated in the second well region.

2. The diode of claim 1, wherein the first type of material comprises an n-type material and the second type of material comprises a p-type material.

3. The diode of claim 1, wherein the first type of material comprises a p-type material and the second type of material comprises an n-type material.

4. The diode of claim 1, further comprising a third finger region situated in the first well region and arranged to be adjacent to the first finger region.

5. The diode of claim 1, wherein the plurality of diode finger regions is configured to dissipate a transient signal generated in response to an electrostatic discharge event.

6. The diode of claim 5, wherein the diode is within or on a semiconductor substrate, and
wherein the plurality of strap regions is configured to collect carrier electrons or carrier holes flowing through the semiconductor substrate in response to the plurality of diode finger regions dissipating the transient signal.

7. A diode, comprising:
a first plurality of diode finger regions, each diode finger region of the plurality of diode finger regions including:
a first well region of a first type of material,
a first finger region of the first type of material situated in the first well region, and
a second finger region of a second type of material, different from the first type of material, situated in the first well region and arranged to be adjacent to the first finger region; and a second plurality of diode finger regions interdigitated with the first plurality of diode finger regions, each diode finger region of the second plurality of diode finger regions including:
a second well region of the second type of material,
a third finger region of the second type of material situated in the first well region, and
a fourth finger region of the first type of material,
wherein the second finger region and the third finger region are situated in the second well region.

8. The diode of claim 7, wherein the first type of material comprises an n-type material and the second type of material comprises a p-type material.

9. The diode of claim 7, wherein the first type of material comprises a p-type material and the second type of material comprises an n-type material.

10. The diode of claim 7, wherein each diode finger region of the first plurality of diode finger regions further comprises:
a plurality of shallow trench isolation (STI) regions, and
wherein an STI region of the plurality of STI regions separates the first finger region and the second finger region.

11. The diode of claim 7, wherein each diode finger region of the second plurality of diode finger regions further comprises:
a plurality of shallow trench isolation (STI) regions, and
wherein an STI region of the plurality of STI regions separates the third finger region and the fourth finger region.

12. The diode of claim 7, wherein the first plurality of diode finger regions and the second plurality of diode finger regions are configured to dissipate a transient signal generated in response to an electrostatic discharge event.

13. The diode of claim 12, wherein the diode is within or on a semiconductor substrate, and
wherein the first plurality of diode finger regions is configured to collect carrier electrons or carrier holes flowing through the semiconductor substrate in response to the second plurality of diode finger regions dissipating the transient signal, and
wherein the second plurality of diode finger regions is configured to collect carrier electrons or carrier holes flowing through the semiconductor substrate in response to the first plurality of diode finger regions dissipating the transient signal.

14. An integrated circuit, comprising:
a first plurality of regions; and
a second plurality of regions interdigitated with the first plurality of regions, the second plurality of regions being configured to collect carrier electrons or carrier holes flowing through a semiconductor substrate in response to the first plurality of regions dissipating a transient signal generated in response to an electrostatic discharge event.

15. The integrated circuit of claim 14, wherein the first plurality of regions comprises:
a plurality of diode finger regions, each diode finger region of the plurality of diode finger regions comprising:
a well region of a first type of material,
a first finger region of the first type of material situated in the first well region, and
a second finger region and a third finger region of a second type of material, different from the first type of material, the second finger region and the third finger region in the well region.

16. The integrated circuit of claim 15, wherein the first type of material comprises an n-type material and the second type of material comprises a p-type material.

17. The integrated circuit of claim 15, wherein the first type of material comprises a p-type material and the second type of material comprises an n-type material.

18. The integrated circuit of claim 14, wherein the second plurality of regions comprises:
a plurality of diode finger regions, each diode finger region of the plurality of diode finger regions comprising:
a well region of a first type of material,
a first finger region of the first type of material situated in the first well region, and
a second finger region and a third finger region of a second type of material different from the first type of material,
wherein the second finger region and the third finger region are situated in the well region.

19. The integrated circuit of claim 18, wherein the first type of material comprises an n-type material and the second type of material comprises a p-type material.

20. The integrated circuit of claim 18, wherein the first type of material comprises a p-type material and the second type of material comprises an n-type material.

* * * * *